United States Patent
Dannels

(10) Patent No.: US 6,541,971 B1
(45) Date of Patent: Apr. 1, 2003

(54) MULTI-DIMENSIONAL SPATIAL NMR EXCITATION

(75) Inventor: Wayne R Dannels, Richmond Hts., OH (US)

(73) Assignee: Koninklijke Philips Electronics, N.V., Eindhoven (NL)

(*) Notice: Subject to any disclaimer, the term of this patent is extended or adjusted under 35 U.S.C. 154(b) by 0 days.

(21) Appl. No.: 09/894,784

(22) Filed: Jun. 28, 2001

(51) Int. Cl.$^7$ ................................................. G01V 3/00
(52) U.S. Cl. ........................ 324/309; 324/307; 324/318
(58) Field of Search ................................ 324/309, 307, 324/310, 311, 314, 318; 128/653.2, 653.5

(56) References Cited

U.S. PATENT DOCUMENTS

| | | | |
|---|---|---|---|
| 4,297,637 A | 10/1981 | Crooks et al. ............... | 324/309 |
| 4,318,043 A | 3/1982 | Crooks et al. ............... | 324/309 |
| 4,480,228 A | 10/1984 | Bottomley ................... | 324/309 |
| 4,563,647 A | 1/1986 | Young ......................... | 324/309 |
| 4,651,097 A | 3/1987 | Iwaoka et al. .............. | 324/309 |
| 4,714,883 A | 12/1987 | Ordidge ....................... | 324/309 |
| 4,748,409 A | 5/1988 | Frahm et al. ................ | 324/309 |
| 4,906,932 A | 3/1990 | Ordidge ....................... | 324/309 |
| 4,985,677 A | 1/1991 | Pauly ........................... | 324/309 |
| 5,010,300 A | 4/1991 | Paley et al. .................. | 324/309 |
| 5,122,748 A | 6/1992 | Oh et al. ..................... | 324/309 |
| 5,349,294 A | 9/1994 | Kasuboski ................... | 324/309 |
| 5,699,801 A | 12/1997 | Atalar et al. ................ | 128/653.2 |
| 6,411,089 B1 * | 6/2002 | Anand et al. ................ | 324/309 |

FOREIGN PATENT DOCUMENTS

EP  0 290 608  12/1988

OTHER PUBLICATIONS

Edelman, et al. "FRODO Pulse sequences: A new means of Eliminating Motion, Flow, and Wrap around Artifacts". *Radiology*, 166 : 231–236, 1988.

Shaka, et al. "Spatially Selective Radiofrequency Pulses". *Journal of Magnetic Resonance*. vol. 59, pp 169–176, 1984.

Bendall, et al. "Theoretical Description of Dapth Pulses, On and Off Resonance, Including Improvements and Extensions Thereof". *Magnetic Resonance in Medicine*, vol. 2, pp91–113, 1985.

Pauly, et al. "A Linear Class of Large–Tip–angle Selective Excitation Pulses". *Journal of Magnetic Resonance*, 82, 571–587 (1989).

Vlaardingerbroek, et al. "Magnetic Resonance Imaging Theory and Practice". pp. 164–168; 188–192; 313–317; 392–393; 464–471.

Grant, et al., "Encyclopedia of Nuclear Magnetic Resonance", 1996, John Wiley & Sons, Chichester, England XP002216479 pp. 4423–4430.

Ordidge, et al., "Single Voxel Whole Body Phosphorous MRS".

* cited by examiner

*Primary Examiner*—Edward Lefkowitz
*Assistant Examiner*—Brij B. Shrivastav
(74) *Attorney, Agent, or Firm*—Fay, Sharpe, Fagan, Minnich & McKee, LLP

(57) ABSTRACT

A main magnet assembly (12) creates a main magnetic field ($B_o$) through an imaging region (10). An operator selects sizes and locations of at least two intersecting slabs (72, 74) in a region of interest. A sequence controller (42) includes a gradient synthesizer (44) and an RF pulse synthesizer (46) that synthesize slab select gradient field pulses (80, 82) and magnetization tipping RF pulses ($\alpha$, $\beta$) to tip or rotate the magnetization in the slabs and an intersection region (70). A first RF pulse ($\alpha$) and slab select gradient tip the magnetization in the first slab and the intersection region out of alignment with the ($B_o$) field (FIGS. 5A, 7A). A second RF pulse ($\beta$) and slab select gradient tip the magnetization in the second slab out of alignment with the ($B_o$) field (FIG. 6B) and further manipulate the magnetization in the intersection region (FIG. 7B). Additional RF pulses ($-\alpha$, $-\beta$) and slab select gradients return the magnetization in the remainder of the first and second slabs into alignment with the ($B_o$) field (FIGS. 5D, 6D) while retaining the magnetization in the intersection region tipped out of alignment with the ($B_o$) field.

31 Claims, 4 Drawing Sheets

α

β

-α

-β

α

β

-α

-β

α

β

-α

-β

MULTI-DIMENSIONAL SPATIAL NMR EXCITATION

BACKGROUND OF THE INVENTION

The present invention relates to the diagnostic imaging arts. It finds particular application in conjunction with magnetic resonance imaging when exciting a region of interest or volume restricted in two or more dimensions and will be described with particular reference thereto. It is to be appreciated that the present invention is also applicable to other applications using magnetic resonance imaging and is not limited to the aforementioned application.

In magnetic resonance imaging, a uniform main magnetic field is created through an examination region in which a subject to be examined is disposed. A series of radio frequency (RF) pulses are applied to the examination region to excite and manipulate magnetic resonance in hydrogen nuclei or other selected magnetic dipoles. Gradient magnetic fields are conventionally applied to encode information in the excited resonance.

Often, it is desired to excite a localized region of interest rather than whole slabs or slices that contain the region of interest. For example, it is often desired to examine blood flow at the heart. If a diagnostician is only interested in the region directly around the heart, collecting data from the regions of the lungs, spine, or muscular regions around the region of the heart increases image time. Moreover, collecting data in these regions can cause image artifacts that degrade the cardiac image.

Several methods exist for exciting resonance in a limited region. When applying fundamental one dimensional slice selective excitation principles multiple times, resonance is excited and manipulated in two intersecting slices or slabs within a patient to generate data from the intersecting region. For example, a 90° excitation pulse excites resonance in a first slice. A 180° inversion pulse in an intersecting slice causes a spin echo to form in the column of intersection. Of course, the magnetization in the non-intersecting portions of the slices or slabs remains perturbed until it decays. Other excitation pulse sequences have also been utilized to render the intersection of two slices or slabs with a different spin profile than the remainder of excited spins. For three dimensional localizing, an RF manipulation pulse is applied in another slice or slab intersecting the parallelepiped intersection of the first two to define a volume that is finite in three dimensions. Various excitation schemes have been used such as 90°-180°-180°, 90°-90°-90°, and the like.

Another method excites areas around the region of interest, and subsequently spoils them with gradient fields, leaving the region of interest unspoiled and excited or ready for excitation. K-space excitation concepts in two and three dimensions are also used. Various techniques use total tip angles that are not large, or apply constraints to mathematical analyses to define a linear or additive nature. Excitation and inversion pulses can be combined and applied to regions, as well as non-inverted pulses followed by the subtraction of 2, 4, or 8 excitations.

Depth pulses that use spatial characteristics of transmit fields are also used. Higher order gradients that are pulsed along with the RF excitation pulses are used. In some applications, signals are excited and scrambled or saturated outside the region of interest to dampen signal from anywhere but the region of interest. RF transmit coils that are very small, and close to the subject are used to excite small regions commensurate with their geometric size and shape.

These prior techniques all possess one or more of five basic limitations. One problem is that they take large amounts of time to perform, and tend to sacrifice scanning efficiency or patient throughput. A second problem is that they perturb signal outside the imaging region, limiting their practical use in interleaved or multiplexed applications. A third problem is that these excitation schemes may have poor spatial localization. A fourth problem is that signal to noise ratio decreases if performed in rapid repetition circumstances. A fifth problem is that additional hardware may be required beyond what is typically provided with an MRI device.

Many of these techniques fall short of desired quality in the images that they produce. Spatial definition of the excitation may not be sharp. Poor sharpness can be a result of broad or blurred excitation regions. Also, unwanted excitation outside the region of interest can cause poor spatial definition.

In certain applications, navigator scans are used to gather information to be used in determining factors in the imaging scan. For instance, navigators can be used to determine cardiac or pulmonary gating, or to determine boundaries of internal structures. A common side effect of navigator scans are dark crosses "burned" into images. These are an inconvenience at best, as the operator must worry about where to place the artifact in the final image so as not to obscure areas of interest. This becomes problematic when imaging larger regions, for instance, the liver, where it is more likely the artifact will obscure portions of the region of interest.

In addition to poor image quality, these methods often affect dipoles outside of the prescribed region such that they are saturated, inverted, or otherwise perturbed from desired conditions. If it is desired to also image these regions, the operator must wait for the perturbations to settle, else, the perturbed dipoles are not in a satisfactory state to precess together with the anticipated signal magnitude and phase. The down time in between regions further lengthens scan time and decreases patient throughput. This is problematic for any application that uses subsequent excitations wherein one excitation target s regions perturbed by one or more previous excitations.

If a subsequent sequence or sequence segment attempts to image through a perturbed slice or slab, the regions with perturbed magnetization give in appropriate responses, such as abnormally high or low signal strength. These inappropriate responses not only create artifacts in the perturbed region, but can cause artifacts elsewhere. Similarly, if one of the non-imaging resonance excitations or manipulations is applied in a slice that intersects a perturbed region, the perturbed region can generate additional echoes or other responses that contribute erroneous signal to the image.

Some of the aforementioned methods require additional hardware, such as specialized RF coil geometry, extra gradient field-producing hardware, and the like. These additions increase cost and system complexity, and are typically not implementable with software upgrades.

The present invention provides a new and improved method and apparatus that overcomes the above referenced problems and others.

SUMMARY OF THE INVENTION

In accordance with one aspect of the present invention, a method of magnetic resonance is provided. Magnetic resonance is excited in a subject by using temporally interleaved, non-commuting radio frequency (RF) pulses and their inverses. The RF pulses are applied in the presence of at least two different gradient fields.

In accordance with another aspect of the present invention, a magnetic resonance apparatus is provided. A main magnet assembly generates a main $B_o$ field in an imaging region. A gradient coil assembly and an RF coil assembly generate non-commuting pulse sequences that excite magnetic resonance in a region finite in two or more dimensions while leaving adjacent regions unperturbed. A gradient synthesizer synthesizes gradient pulses in accordance with a selected geometry. An RF pulse synthesizer synthesizes RF pulses in accordance with the selected geometry. A phase and timing circuit orders the gradient and RF pulses. A reconstruction processor processes received magnetic resonance signals into an image representation of a subject. Optionally, the phase and timing circuit spaces the gradient and RF pulses according to the $B_o$ field strength and the chemical shift between resonances.

In accordance with another aspect of the present invention, a magnetic resonance apparatus is provided. A magnet means generates a temporally constant $B_o$ magnetic field through a region of interest, which includes at least first and second subregions that intersect at an intersection region. A means for rotating rotates magnetization in the first subregion. Subsequently, a means of concurrent manipulation rotates magnetization in a remainder of the second subregion away from the $B_o$ field. A third means returns magnetization back to alignment with the $B_o$ field everywhere except the intersection region.

In accordance with another aspect of the present invention, a method of magnetic resonance is provided. At least three radio frequency pulses and their inverses are applied to an imaging region in a temporally interleaved fashion, each in the presence of a different gradient.

In accordance with another aspect of the present invention, a method of inducing nutation of magnetic moments is provided. First and second RF pulses are applied to an imaging region in the presence of first and second gradients to produce first and second selective excitations. Third and fourth series of RF pulses and gradients are applied to the imaging regions forming inverses of the first and second pulses, respectively.

In accordance with another aspect of the present invention, a method of exciting magnetic moments is provided. First and second series of non-commutative RF pulses are transmitted into an imaging region, each series substantially returning magnetic moments to their original configuration.

One advantage of the present invention is that it is implementable with purely software upgrades.

Another advantage resides in increased patient throughput.

Another advantage resides in sharper images.

Another advantage resides in the ability to image select volumes.

Another advantage resides in the ability to rapidly sequence scans of adjacent regions within the subject.

Yet another advantage is that it reduces image artifacts.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED

Figure 1:
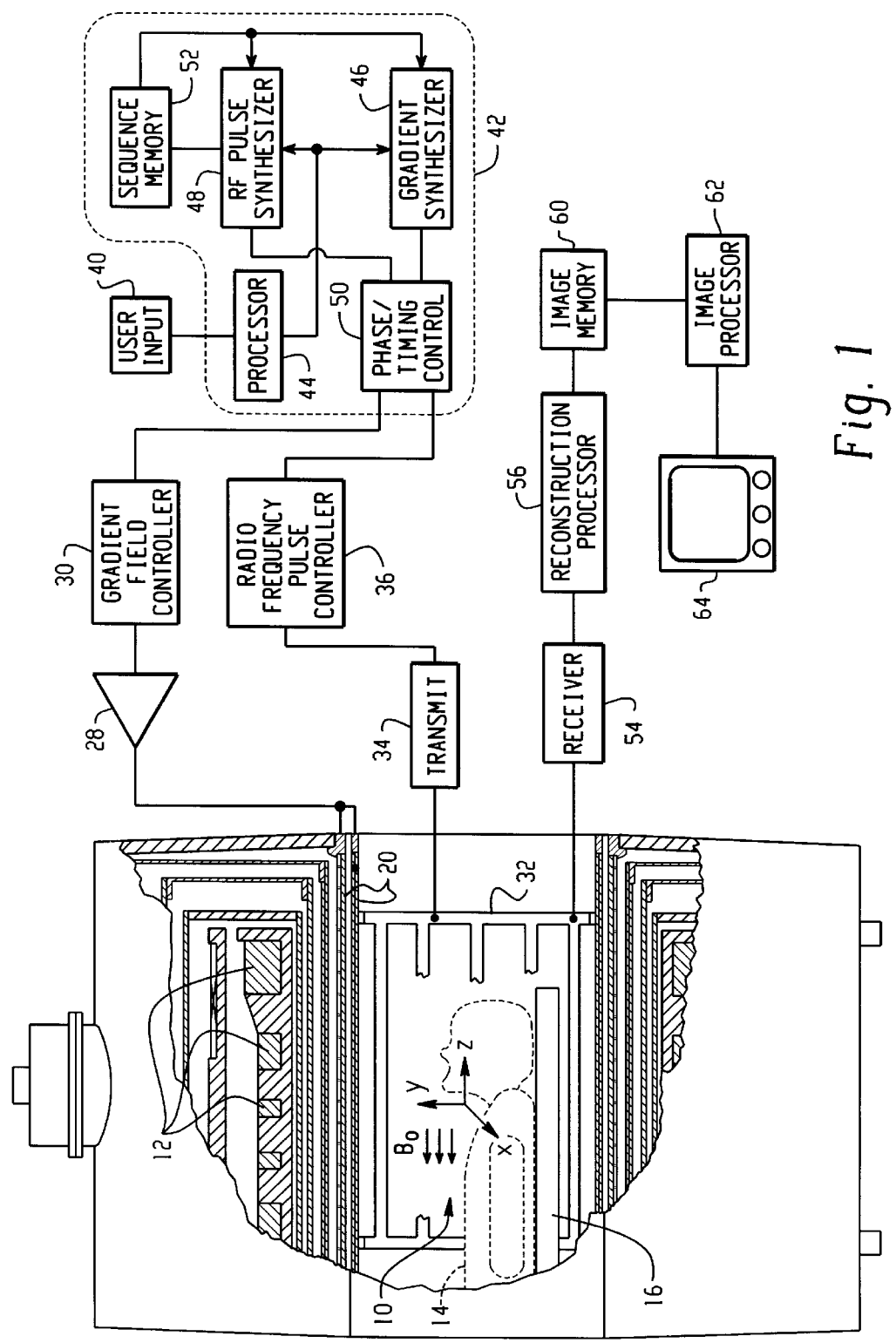
FIG. 1 is a diagrammatic illustration of an MRI apparatus in accordance with the present invention.

With reference to FIG. 1, a higher field bore type MRI system is amenable to precise tipping of magnetization, as described below. It is to be appreciated, however, that the invention is also applicable to open or vertical field MRI systems. In the illustrated embodiment, an imaging region 10 is defined within the bore of a solenoidal, preferably superconducting, main magnet 12. The main magnet generates a temporally constant, main magnetic field $B_o$ axially through the imaging region 10 along a z-axis. A subject 14 is supported in the imaging region 10 by a patient support 16 that preferably moves the subject as needed longitudinally along the axis of the bore.

For imaging, magnetic field gradient coils 20 are disposed within the bore of the main magnet 12 in the illustrated embodiment. The gradient coils are connected by gradient amplifiers 28 to a gradient magnetic field controller 30. In bore type MRI systems, the gradient coils traditionally are mounted around the bore. The gradient magnetic field controller 30 causes current pulses which are applied to the gradient coils such that gradient magnetic fields are superimposed on the temporally constant and uniform field $B_o$ across the imaging region 10. The gradient fields are typically generated along the longitudinal or z-axis, a vertical or y-axis, and a transverse or x-axis.

In order to excite magnetic resonance in selected dipoles of a subject disposed in the imaging region 10, a whole body radio frequency coil 32 is disposed inside the gradient coil 20 around the imaging region 10. At least one radio frequency transmitter 34, preferably a digital transmitter, causes the radio frequency coil to transmit radio frequency pulses requested by a radio frequency pulse controller 36 to be transmitted into the imaging region 10.

An operator enters a desired geometry for the region to be excited at a user input terminal 40 such as a personal computer workstation, or other control panel. In the preferred embodiment, the user is able to select between a variety of available geometries (e.g., column, cube, parallelepiped, sphere, etc.) and size the selected geometry. A sequence controller 42 includes a processor 44 that translates the selected geometry into a selective excitation sequence that limits excitation to a corresponding region within the subject 14.

A gradient synthesizer 46 synthesizes slab select gradient pulses that correspond in space to the region of excitation. For example, if a right square column is the selected geometry of the excitation region, then the gradient synthesizer 46 synthesizes gradient pulses that define the corresponding orthogonal slabs that intersect to define the excitation region. A radio frequency pulse synthesizer 48 synthesizes a sequence of radio frequency pulses that excite and manipulate magnetic resonance in the defined slabs. A phase and timing controller 50 analyzes the main magnetic field strength $B_o$, in conjunction with the proposed gradient fields, and assigns a timing scheme for the pulses that conforms to the resonance frequency of the dipoles of interest in a magnetic field of strength $B_o$, i.e., the resonance frame of reference can be treated as stationary.

When an image is to be generated from the excited resonance, an imaging sequence, e.g. an EPI or EVI sequence, is selected from an imaging sequence memory 52. The resonance signals are detected by the RF coil 32 or by surface or other local coils (not shown) and demodulated by one or more receivers 54, preferably digital receivers. The digital data is processed by a reconstruction processor 56 into volumetric or other image representations such as by applying a two-dimensional Fourier transform algorithm or other appropriate reconstruction algorithm. The image representations are stored in a volumetric image memory 60. An image processor 62, under operator control, withdraws selected image data from the volume memory 60 and formats it into appropriate data for display on a human readable display 64, such as a video monitor, active matrix monitor, liquid crystal display, or the like. The excited resonance can also be used with spectroscopic and other non-imaging sequences.

A general characteristic of rotations is to be appreciated here. With reference to FIGS. 2A–2F a geometric phenomenon is illustrated. When multiple rotations are performed in three dimensional space the net effect depends upon the order in which they are applied.

Figure 2A:
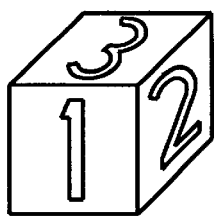
FIGS. 2A–2F illustrate the general geometry characteristic that the resultant of a series of rotations depends upon the order in which the rotations are performed.
Figure 2B:
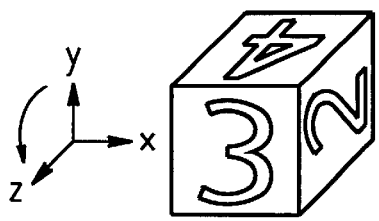
Figure 2C:
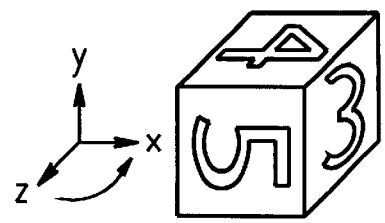
Figure 2D:
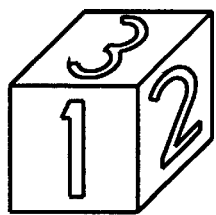
Figure 2E:
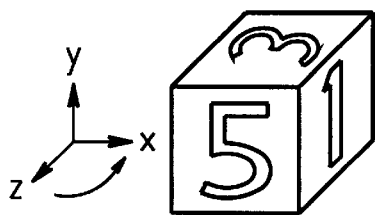
Figure 2F:
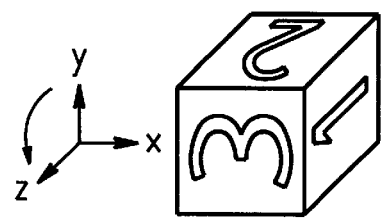

FIGS. 2A–2F show the same three dimensional object, perhaps a child's block, and different successive rotations. FIG. 2A is a starting orientation of the exemplary object. FIG. 2B shows the result of a rotation about an x-axis. FIG. 2C shows the result of a rotation about the x-axis, followed by a rotation about a y-axis. FIG. 2D again shows the starting orientation, identical to FIG. 2A. FIG. 2E shows the result of applying a y-axis rotation to the starting orientation. FIG. 2F shows the result of a y-axis rotation followed by an x-axis rotation, i.e., the same rotations but the opposite order from FIGS. 2B and 2C. Note that while FIGS. 2C and 2F are both obtained by using the same rotations from the same starting positions, they are different results depending on the order of the operation. That is, the rotations do not commute. Such operations are routinely studied in the mathematical field of Group Theory, and are well understood.

A mathematical description of operations which do not commute, is that if operations A and B have respective inverses denoted −A and −B, then the composition A, B, −B, −A performed in succession will be the identity operation. But the alternate order A, B, −A, −B, is not identity if the operations A and B do not commute.

Returning to the magnetic resonance excitation techniques of this invention, series or rotations will of course be applied to magnetic moments or bulk magnetization in samples.

Figure 3:
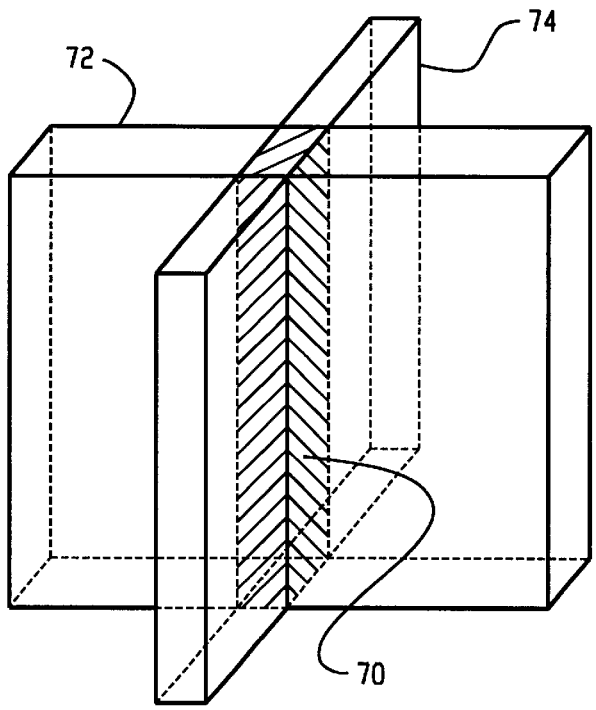
FIG. 3 illustrates two intersecting slabs in which the magnetization is manipulated in accordance with the sequence of FIG. 4.
Figure 4:
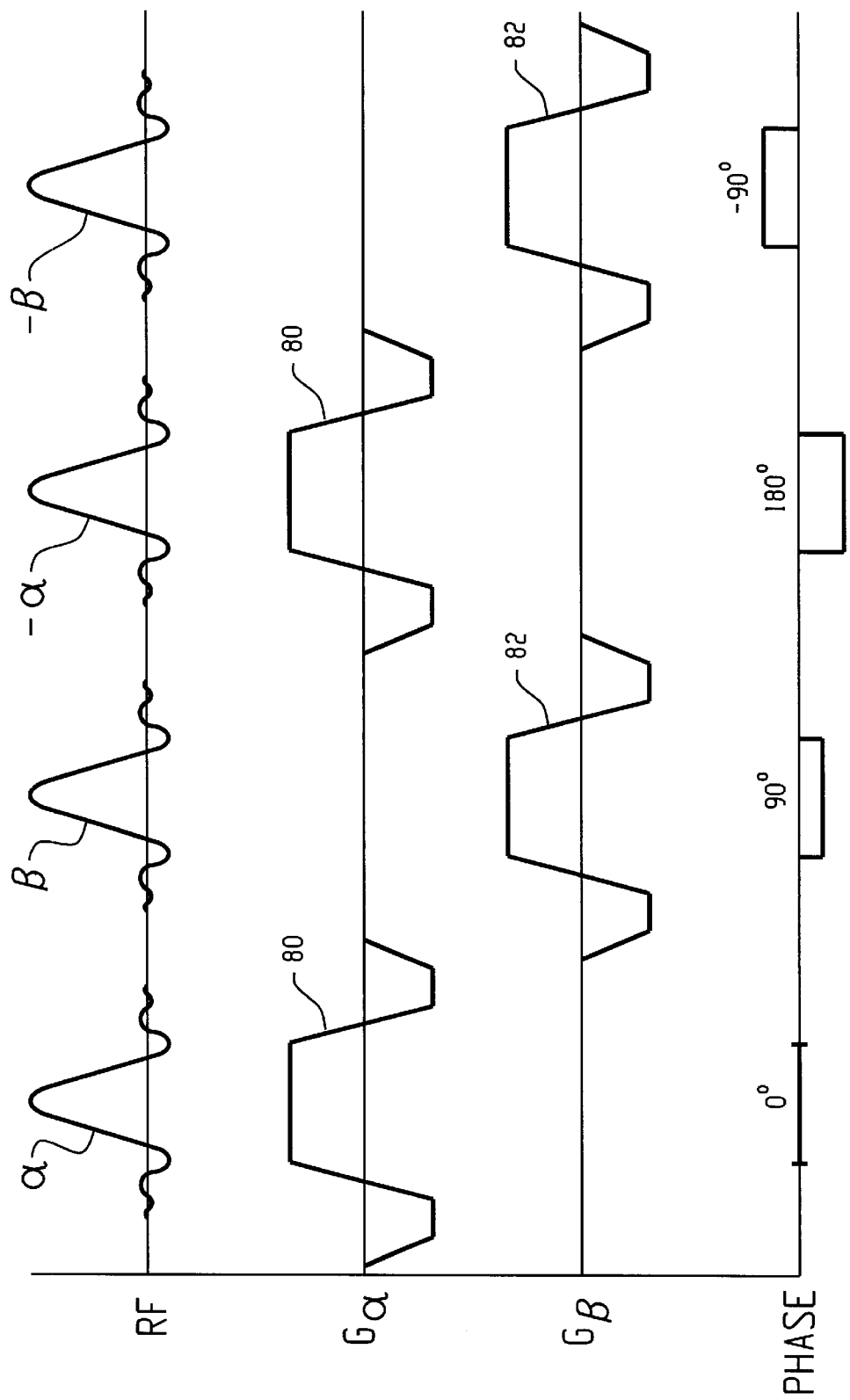
FIG. 4 is a pulse diagram depicting an excitation sequence, in accordance with the present invention.
Figure 5A:
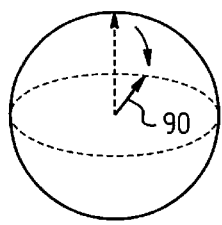
FIGS. 5A–D are illustrations of the magnetization manipulation, shown in a frame of reference rotating at the resonance frequency, induced by the sequence of FIG. 4 in a first slab of FIG. 3.
Figure 6A:
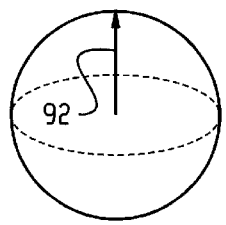
FIGS. 6A–D are illustrations of the magnetization manipulation, shown in a frame of reference rotating at the resonance frequency, in the other slab of FIG. 3.
Figure 7A:
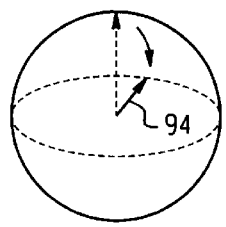
FIGS. 7A–D are illustrations of the magnetization manipulation, shown in a frame of reference rotating at the resonance frequency, in the intersection of the FIG. 3 slabs.

With reference to FIGS. 3 and 4, magnetic resonance is excited in a volume 70 of a subject with minimal effect on surrounding regions. The region 70 is defined by two intersecting slabs, 72, 74. The slab 72 is excited by a first RF excitation pulse α in the presence of a first slab select gradient field 80. The slab select gradient is sized and sloped such that the first RF pulse α excites resonance, i.e. tips down the magnetization vector, only in the selected slab 72. The RF pulse α in the illustrated embodiment tips the dipoles in the slab 72 90° from their equilibrium orientation in-line with the main field $B_o$, see FIGS. 5A and 7A. Because the excitation is limited to slab 72 the magnetization in slab 74 and other regions is not tipped, as shown in FIG. 6A.

Figure 5B:
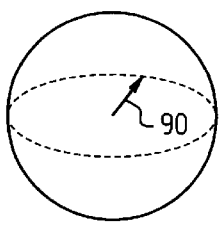
Figure 5C:
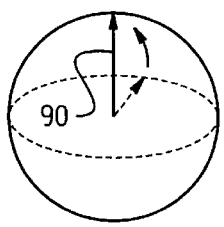
Figure 6B:
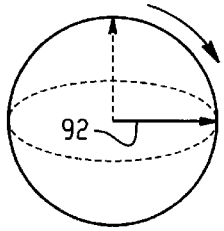
Figure 7B:
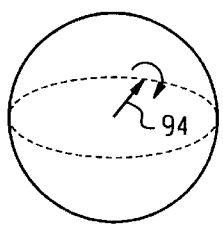

Subsequent to the excitation of the slab 72, a second RF pulse β temporally commensurate with a second slice gradient pulse 82 excites resonance only in the slab 74, as shown in FIG. 6B. Slab 72 and other regions are not affected by the second RF pulse β, as shown in FIG. 5B. However, the magnetization in the intersection region is acted upon by both the first RF pulse α, FIG. 7A, and the second RF pulse β, FIG. 7B. In the illustrated example, the magnetization is rotated into the transverse plane by the first pulse. Once the magnetization is in the transverse plane and oriented parallel to the rotation axis of the second RF pulse, the second RF pulse β does not further change the direction of the magnetization vector. Note that the order in which the rotations are applied determines the result, i.e. the rotation operations do not commute.

Figure 6C:
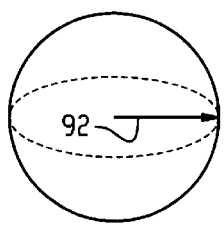
Figure 7C:
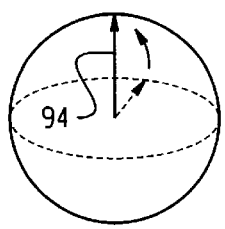

Subsequently, a third RF pulse −α, which is the inverse of the first RF pulse a by virtue of a 180° phase shift, is applied concurrently with a repetition of the first slab select gradient pulse 80. In the preferred embodiment, the pulse α is an amplitude modulated waveform symmetric in time about its midpoint. The inverse pulse −α is composed of the same amplitude modulated pulse waveform, plus a multiplicative phase term which is shifted by 180° relative to a preferably constant phase term associated with the first RF pulse α. Being that the same gradient field is applied for both RF pulses a and −α, both pulses affect the same slab 72 within the subject. The pulse −α has an opposite effect to the pulse α reversing its effect in regions that have undergone only the pulse α. That is, the third RF pulse −α rotates the magnetization in slab 72 back into alignment with the z-axis, i.e. the $B_o$ field. The third RF pulse −α has no effect on the magnetization in the majority of the second slab 74 and other regions outside the first slab, FIG. 6C. However, the intersection region 70 is affected like the rest of the slab 72, i.e. the magnetization is rotated back into alignment with the $B_o$ field, FIG. 7C. At this point in time, the magnetization vector is aligned with the $B_o$ field, i.e. resonance is not excited, everywhere except the portions of the slab 74 that are not in the intersection region 70.

Figure 5D:
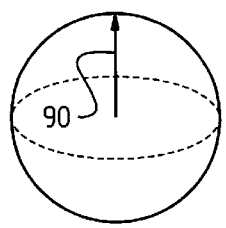
Figure 6D:
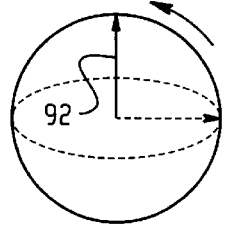

Following the third RF pulse −α, a fourth RF pulse −β is applied to the slab 74 concurrently with the slab select gradient pulse 82, but acting inversely to the prior β by virtue of the 180° phase difference. The fourth RF pulse −β has the opposite effect of the second RF pulse β, returning the magnetization to the original configuration aligned with the $B_o$ field in the slab 74 outside of the intersection region 70, FIG. 6D. The fourth RF pulse −β has no effect on dipoles outside the slab 74, FIG. 5D.

Figure 7D:
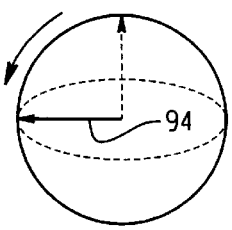

However, the magnetization in the intersection region is also tipped 90°, FIG. 7D. Thus, after the fourth RF pulse, resonance is excited in the intersection region and is aligned with the $B_o$ field, i.e. unperturbed, everywhere else.

As a result of the gradient and RF pulse sequences described above, only the intersection 70 of the two slabs 72, 74 is left excited. The dipoles in the regions of the slabs other than the intersection 70 have been returned to their original configuration. It is important to note that the order in which the pulses are applied is significant, that is, the pulses are non-commutative. The preferred order, α, β, -α, -β, yields a different result than, say, α, -α, β, -β, which would return all dipoles to their original positions, including the ones in the intersecting region. Other magnetization rotation operation combinations are also contemplated, such as β, -α, -β, α; or the like. Analogously, resonance can be excited everywhere except in the intersection region. For example, after an α, β, -α, -β sequence, application of a β RF pulse without a slice select pulse will align the magnetization in the intersection region with $B_o$ and tip it out of alignment everywhere else.

In a preferred embodiment, the incurred rotations of magnetization and the phase of that magnetization from the application of one pulse to the next is substantially generated by the RF pulses, and is not further complicated by the cumulative effect of gradients. Thus, the time integral of each gradient from the time of the first RF pulse to the second RF pulse is zero. The time integral of each gradient from the time of the second RF pulse to the third RF pulse is zero. The time integral of each gradient from the time of the third RF pulse to the fourth RF pulse is zero. Similar conditions upon gradient waveforms between successive RF pulses may optionally be imposed on other instances of the invention which utilize more RF pulses than four. Such cases with more pulses are described later in the body of this disclosure.

The concept of limiting two dimensions of the excited region can easily be extended to limiting in three dimensions, yielding a region with a finite volume and to the creation of complex shaped excitation regions. The sequence of gradients and RF pulses as described above yielded an excited column. For simplicity, a plurality of magnetization rotation operations can be labeled as a rotation operator. For example, the α, β, -α, -β pulse sequence can be defined as a single rotation operator γ. An RF pulse δ along with a slab select gradient field corresponding to a slab that intersects a limited portion of the intersection region tips dipoles of this slab into the transverse plane. As the sequence α, β, -α, -β limits the imaging region to a column, adding the restriction in the third dimension from the slab via a sequence γ, δ, -γ, -δ limits the region of interest to a voxel or region at the intersection of the three slabs. In extended form, the sequence takes the form α, β, -α, -β, δ, β, α, -β, -α, -δ. It is to be understood that adding further slabs to limit or shape the imaging region is well within the scope of the present invention.

The preceding description assumes that the RF pulses are applied on resonance, or that they are applied at times that correspond to integral cycles of any off resonance frequency. FIGS. 5–7 assume a rotating frame of reference, that is, they ignore the fact that the dipoles are actually rotating around the z-axis at the resonance frequency after they are tipped. Pulse sequences that use RF pulses applied at non-integer multipliers of the resonance period are also contemplated. Consider for example, a sub-sequence of pulses and pauses using a pause that is less than ¼ of the resonance period in the order α, pause, -2α, pause, α. If the pauses are the same duration, the preceding sequence of pulses substantially returns the dipoles to their original position, as if they were unperturbed. Such a sub-sequence may then be interleaved or partially interleaved with another sub-sequence such as β, pause, -2β, pause, β, wherein the pulses α and β are chosen to be non-commutative. Thus, if the first sub-sequence is applied in the presence of one gradient field, and the second sub-sequence is applied in the presence of a second gradient, beneficial excitations can be generated in an area of intersection.

Such sub-sequences are considered to be within the scope of this invention, in part because the pulse pair -2α, may be considered a form of an inverse pulse to the initial pulse α albeit the inverse pulse exhibits a different apparent structure.

Additionally, the timing can be set to utilize the difference between the resonance frequencies between dipoles with different chemical bonding characteristics. One such application is imaging fat and water. The hydrogen dipoles in fat and water have slightly different resonance frequencies, and the RF pulses can be timed to include or exclude either as desired.

As an example of this optional refinement, consider the pulse sequence as in FIG. 4 wherein the resonant frequency is set to that of water. Additionally, prescribe the time duration between successive RF pulses to match ¼ cycle of phase evolution for the incremental frequency for the off-resonance shift of fat relative to water at the given main magnetic field strength $B_o$. Such a sequence selectively excites water within the area of intersection, leaving fat unexcited, which may prove to be beneficial in the context of some specific application.

The illustrated embodiment used 90° pulses for simplicity of illustration. It is to be understood that tip angles other than 90° are also contemplated.

In one application, an imaging sequence is conducted in one region of the subject. The above described localized excitation technique is interspersed into the imaging sequence as a navigator to monitor nearby physical motion. No regions outside of the navigation area are perturbed, preferably using relatively small tip angles with fast recovery times.

The sizing in various directions, the location, and the orientation of excited regions can be adjusted, in manners obvious to those skilled in the art. To accomplish these geometric adjustments, amplitudes and durations of gradient waveforms can be scaled, amplitudes and durations of RF waveforms can be scaled, RF frequency offsets can be applied, gradient waveforms can be applied along multiple hardware axes in parallel, and the like.

It is appreciated that the nutations of magnetic moments which can be generated in accordance with this invention are not limited to manipulations of magnetization initially located along the main magnetic field direction, i.e., initially transverse magnetization may be advantageously manipulated, in addition to initially longitudinal magnetization. In FIG. 4, for example, the first negative lobe of gradient waveform Gα 80 can be used to affect the response of initially transverse magnetization. Optionally, if only magnetization which is initially aligned longitudinally is of concern, then it is possible to omit the first trapezoidal lobe in FIG. 4, which occurs temporally before the first RF pulse α.

For rotations of three dimensional objects, the degree to which a pair of rotations do not commute depends both on the angular size of each rotation, plus the degree to which the axes of the rotations are parallel or perpendicular. If the two rotations are about parallel axes, or about antiparallel axes, then they commute. In general, for two rotations of two fixed angular lengths, the difference between the two cascaded rotations of opposite order is greatest when rotations are about orthogonal axes. Thus, it is beneficial, if one wishes to generate a large and efficient excitation from small or limited RF pulses, to choose pulses α and β with a phase difference of 90° in the rotating frame. FIG. 4 exemplifies a preferred embodiment wherein the β pulse is applied with a phase 90° less than that of the α pulse in the rotating frame.

The manipulation of dipoles along two or more dimensions need not be limited to spatial dimensions. It is to be understood that at least one dimension may be that of a chemical shift or a resonant frequency offset dimension. As is well understood in the art, an RF pulse with limited frequency content when applied in the presence of a gradient affects spatial regions, but if the same pulse is applied without an effective gradient, it excite bands of frequencies which correspond to chemical shifts of species relative to some reference frequency.

This anticipates that at least one of the dimensions in which the excitation becomes limited may be a chemical shift dimension. The excitation can be in two, three, four, or more dimensions. With reference to FIG. 4, in the special case where gradients 80 are effectively zero, or where gradients 82 are effectively zero, the net excitation substantially affect only the intersection of a range of chemical shift species with a spatially defined slab. Such an excitation is sometimes referred to in the literature as a spatial-spectral excitation. As an example, this embodiment can be used to excite the water, signal within a spatial slab, while leaving the primary resonances of fat unexcited. It is to be understood that it is fully within the scope of this application that one or the other of the two magnetic field gradients used in this device may be effectively zero. In some applications, the frequency specific pulse is applied in addition to the spatially specific pulses and is applied without an inverse frequency specific pulse.

It is appreciated that pulses which act as inverses to other pulses may be prescribed or generated in many fashions. A typical MR control system may allow independent control of transmit RF amplitude, phase, offset frequency, and base frequency. Thus, generating a portion of RF pulse which undoes the effect of a prior pulse might be accomplished with a net phase shift of 180°, or with a negated amplitude. Phase shifts may in turn be generated by the accumulated effect of transient frequency shifts. Conduction pathways might even be switched or reversed. These are all meant to be examples of methods of generating inverse pulses, within the scope of the invention.

If a pulse consists of a temporal series of varying components, whether those components involve varying RF amplitudes, RF phases, or RF frequencies, or gradient amplitudes, then one method to prescribe an inverse is the following. Treat the first pulse as a temporal succession of brief constant intervals. To form the inverse, invert each constant segment in a point-by-point fashion, but also reverse the time order of the entire sequence. Such inversions of phase modulated or frequency modulated pulses are contemplated within this invention.

It is further contemplated that design freedom exists in choosing gradient amplitudes. For example, during the inverse pulse, it may be beneficial for other reasons, such as to cancel eddy currents, that the gradient during the inverse pulse might be chosen to be the opposite amplitude polarity as during the original pulse. The negated gradient causes an apparent reversal of frequencies about the resonant frequency. To reverse the frequency content of the transmit RF pulse accordingly, it may be possible to specify the inverse pulse in the time domain in a point-by-point manner as the complex conjugate of the corresponding points in the original pulses.

It is further recognized that, it is sufficient to prescribe pulses which return magnetization to prior orientations. Such returning pulses need not retrace the magnetization trajectories of the original pulse. Consider a pulse which is a 90° rotation about the x-direction in a rotating frame. One natural choice for an inverse pulse would be a −90° rotation about x, effectively retracing the trajectory in a time-reversed fashion. But another trajectory which could be considered is a 270° rotation about x. Such a pulse acts as an inverse as required in this invention, in that it returns the magnetization which had been tipped from a longitudinal state back to a longitudinal state.

It is further contemplated that an inverse pulse might only approximately return magnetization to its prior location.

The invention may find use in accomplishing any of many magnetic resonance techniques. As previously noted, the excitation of columns may be beneficial in making navigator readouts for motion correction in conjunction with other image acquisition methods. The technique may be beneficially used in line scan imaging, or more specifically, in line scan diffusion weighted imaging. The technique may be used to induce spatial-spectral excitations. The technique may further be used in exciting multiple spectroscopic voxels in an interleaved fashion. In yet another contemplated usage, this invention can be used to induce saturation of a region, thereby affecting that region prior to detection with subsequent MR manipulations. The invention is not intended to be limited to specific end applications of magnetic resonance, nor is it meant to be limited to the scope of inclusion only in applications which have been described herein. It is fully appreciated that this technique applies generally to MR signal generation and manipulation, and that these generation and manipulation steps can be combined in numerous fashions with other manipulations or detection to accomplish specific functions or utility.

The effectiveness of this technique in specific applications may be reduced or limited by off-resonance effects or by relaxation rates, for example. The degree of such limitations may depend upon numerous factors, including at least gradient strength, gradient switching rates, main magnetic field strength, magnetic field homogeneity, strength of $B_l$ RF transmit fields, $B_l$ field uniformity, and effectiveness of shimming procedures. Such dependencies in pulse sequences are commonplace in magnetic resonance imaging and related arts. The literature is replete with examples of pulse sequence techniques for which the practical utility of the technique has changed as available MR devices gained better technical specifications or higher powers, etc. Echo planar imaging, FISP imaging, fat saturation, and fast spin echo imaging are examples which have gained practical utility as subsystem specifications have changed over the years. The claims of this technique are not intended to be limited by the commonplace performance levels of scanners available at any particular point in time. It is fully appreciated that the effectiveness of practical application of this invention will be related to hardware performance specifications and the like.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance comprising:
exciting and manipulating magnetic resonance in a subject by using temporally interleaved non-commuting radio frequency pulses and their inverses, including
applying a first radio frequency pulse temporally commensurate with a first slab select gradient, to define a first excited slab within the subject;
applying a second radio frequency pulse temporally commensurate with a second slab select gradient, different from the first gradient, to define a second excited slab intersecting the first excited slab
applying an inverse of the first radio frequency pulse temporally commensurate with a repetition of the first slab select gradient;
applying an inverse of the second radio frequency pulse temporally commensurate with a repetition of the second slab select gradient to yield a net excitation in an intersection of the first and second slabs and substantially no excitation outside of the intersection;
applying at least two different gradient fields with the radio frequency pulses.

2. The method as set forth in claim 1, wherein one of the at least two gradient fields is substantially zero, and one of the radio frequency pulses is spectrally selective such that the excited intersection is limited in at least one spatial dimension and in one frequency dimension.

3. The method as set forth in claim 1, further including:
spatially encoding and receiving magnetic resonance signals from the intersection of slabs and reconstructing them into an image representation of the intersection.

4. The method as set forth in claim 1, further including:
saturating resonance in the intersection of the slabs and generating a magnetic resonance image of a region adjacent the intersection, which region intersects at least one of the slabs;
using magnetic resonance signals from the intersection of the slabs to monitor physiology adjacent the intersection.

5. The method as set forth in claim 1, further including:
applying a third radio frequency pulse temporally commensurate with a third slab select gradient to define a third slab intersecting the first and second slabs to yield a net excitation only at an intersection of the three slabs.

6. The method as set forth in claim 5, wherein the first radio frequency pulse is a and the second radio frequency pulse is β and they are transmitted in the order α, β, -α, -β, where -α is an inverse of α and -β is an inverse of β.

7. The method as set forth in claim 6, wherein the third radio frequency pulse is δ and the radio frequency pulses are transmitted in the order α, β, -α, -β, δ, β, α, -β, -α, -δ.

8. The method as set forth in claim 1, wherein the combination of the first radio frequency pulse and the first gradient is non-commutative with the combination of the second radio frequency pulse and the second gradient.

9. The method as set forth in claim 1, wherein applying radio frequency pulses includes applying 90° RF pulses.

10. The method as set forth in claim 3, wherein a phase of the second RF pulse differs from a phase of the first RF pulse by 90°.

11. The method as set forth in claim 1 wherein the step of exciting and manipulating resonance includes:
applying a spectral frequency selective radio frequency pulse.

12. The method as set forth in claim 11 wherein the spectral frequency selective pulse is applied in the absence of a gradient magnetic field.

13. The method as set forth in claim 1 wherein at least one of the radio frequency pulses is a temporal series of RF components and the inverse RF pulse of the at least one RF pulse includes:
a series of RF components which are inverses of the at least one RF pulse components in a reverse temporal order.

14. The method as set forth in claim 1 wherein the gradient pulses applied during a radio frequency pulse and its inverse radio frequency pulse are of opposite amplitude polarity.

15. The method as set forth in claim 1 wherein at least one of the inverse RF pulses is formed as:
a complex conjugate of corresponding points, in a point-by-point manner in the time domain, of the RF pulse that it is an inverse to.

16. The method as set forth in claim 1 further including:
adjusting a temporal interval between radio frequency and inverse radio frequency pulses to promote resonance signals from one chemical species and suppress resonance signals from another chemical species.

17. A magnetic resonance apparatus comprising:
a main magnet assembly for producing a $B_o$ main magnetic field in an imaging region;
a gradient coil assembly and an RF coil assembly that generate non-commutative pulse sequences, the sequences exciting magnetic resonance in a region of interest while leaving regions other than the region of interest substantially unperturbed;
a gradient synthesizer for synthesizing gradient pulses in accordance with a selected geometry;
a radio frequency pulse synthesizer for synthesizing radio frequency pulses in accordance with the selected geometry;
a phase and timing circuit that orders and spaces the gradient and radio frequency pulses according to a magnetic field strength; and,
a reconstruction processor for processing received magnetic resonance signals from the region of interest into an image representation of a subject.

18. The magnetic resonance apparatus as set forth in claim 17, further including:
a means for tipping magnetization out of alignment with the $B_o$ main magnetic field in one slab of finite thickness in the subject;
a means for tipping magnetization out of alignment with the $B_o$ field in a second slab of finite thickness, the first and second slabs intersecting at an intersection region;
a means for leaving at least a portion of magnetization in the intersection region tipped out of alignment with the $B_o$ field while untipping the magnetization in portions of the first and second slabs back into alignment with the $B_o$ field;
a means for transmitting a first RF pulse a temporally commensurate with a first slab select gradient and a second RF pulse β temporally commensurate with a second slab select gradient in the order α, β, -α, -β, where -α is an inverse of α and -β is an inverse of β.

19. The magnetic resonance apparatus as set forth in claim 18, further including:
a means for transmitting a third RF pulse γ temporally commensurate with a third slab select gradient defining a third slab intersecting the first two slabs to yield a net excitation only at an intersection of the three slabs.

20. The magnetic resonance apparatus as set forth in claim 18, further including: a means for one of:
   a) encoding and reconstructing magnetic resonance signals received from the imaging region;
   b) saturating magnetization in portions of the imaging region;
   c) navigating the imaging region prior to an imaging sequence; and,
   d) initiating a spectroscopic imaging process using magnetic resonance signals.

21. A magnetic resonance method comprising:
   generating a temporally constant $B_o$ magnetic field through a region of interest, the region of interest including at least first and second subregions that intersect in an intersection region;
   rotating magnetization in the first subregion of the region of interest out of alignment with the $B_o$ field;
   concurrently manipulating the magnetization in the intersection region and rotating the magnetization in a remainder of the second subregion out of alignment with the $B_o$ field;
   manipulating the magnetization in the intersection region and remainders of the first and second subregions to return the magnetization out of alignment with the $B_o$ field in the remainder of the first and second subregions.

22. A magnetic resonance apparatus comprising:
   a magnet means for generating a temporally constant $B_o$ magnetic field through a region of interest, the region of interest including at least first and second subregions that intersect in an intersection region;
   a means for rotating magnetization in the first subregion of the region of interest out of alignment with the $B_o$ field;
   a means for concurrently manipulating the magnetization in the intersection region and rotating the magnetization in a remainder of the second subregion out of alignment with the $B_o$ field;
   a means for manipulating the magnetization in the intersection region and remainders of the first and second subregions to return the magnetization out of alignment with the $B_o$ field in the remainder of the first and second subregions.

23. The magnetic resonance apparatus as set forth in claim 22, further including:
   a means for spatially encoding the magnetization in the intersection region.

24. The magnetic resonance apparatus as set forth in claim 22, further including:
   a means for exciting and spatially encoding magnetic resonances in a third subregion of the region of interest, which third subregion intersects at least one of the first and second subregions;
   a means for reconstructing the spatially encoded magnetization into an image representation.

25. The magnetic resonance apparatus set forth in claim 22 further including:
   a means for spectrally encoding magnetic resonance in the intersection region.

26. A method of magnetic resonance comprising:
   applying at least three radio frequency pulses and their inverses to an imaging region in a temporally interleaved order, each of the three pulses being applied in the presence of one of at least three different gradients, one of the at least three different gradients being substantially zero; and
   the radio frequency pulses being chosen to be non-commutative, exciting an intersection of two spatial slabs plus a band of chemical shift resonances.

27. A method of inducing nutation of magnetic moments comprising:
   applying a first RF pulse to an imaging region in the presence of a first gradient to form a first selective excitation,
   temporally after the first RF pulse, applying a second RF pulse to the imaging region in the presence of a second gradient to form a second selective excitation;
   a nutation induced from the first RF pulse being non-commutative with a nutation induced by the second RF pulse in a region of intersection;
   applying a third series of RF and gradient pulses to substantially form an inverse of the first selective excitation, at least a portion of the third series of RF pulses being applied temporally after the second RF pulse; and,
   applying a fourth series of RF and gradient pulses to substantially form an inverse of the second selective excitation, at least a portion of the fourth series of RF pulses being applied temporally after at least a portion of the third series of RF pulses.

28. A method of exciting magnetic moments comprising:
   transmitting a first series of RF pulses and gradient pulses including at least a first RF pulse in the presence of a first gradient such that the first series of pulses substantially returns the magnetic moments to an original orientation;
   transmitting a second series of RF pulses and gradient pulses including at least a second RF pulse in the presence of a second gradient such that the second series of pulses substantially returns the magnetic moments to an original orientation, the first series of RF pulses being non-commutative with the second series of RF pulses at least in a region of intersection.

29. The method as set forth in claim 28, wherein at least a portion of the first series of RF pulses is temporally interspersed between at least a portion of the second series of RF pulses.

30. The method as set forth in claim 29, wherein the region of intersection is constrained to the spatial intersection of two slabs.

31. The method as set forth in claim 29, wherein the region of intersection is constrained by at least the intersection of a spatial region and a range of resonant frequencies.

* * * * *